US012635072B2

(12) United States Patent
Pan et al.

(10) Patent No.: US 12,635,072 B2
(45) Date of Patent: May 19, 2026

(54) VIBRATION DETECTOR AND ELECTRICAL APPARATUS HAVING THE SAME

(71) Applicant: Tyco Electronics (Shanghai) Co., Ltd., Shanghai (CN)

(72) Inventors: Lei Pan, Shanghai (CN); Jin Darren Chen, Shanghai (CN)

(73) Assignee: Tyco Electronics (Shanghai) Co., Ltd., Shanghai (CN)

( * ) Notice: Subject to any disclaimer, the term of this patent is extended or adjusted under 35 U.S.C. 154(b) by 234 days.

(21) Appl. No.: 18/457,608

(22) Filed: Aug. 29, 2023

(65) Prior Publication Data

US 2024/0074044 A1 Feb. 29, 2024

(30) Foreign Application Priority Data

Aug. 31, 2022 (CN) .......................... 202211060362.0

(51) Int. Cl.
| | |
|---|---|
| *H05K 5/00* | (2025.01) |
| *H05K 1/03* | (2006.01) |
| *H05K 1/181* | (2026.01) |
| *H05K 3/28* | (2006.01) |

(52) U.S. Cl.
CPC .............. *H05K 1/03* (2013.01); *H05K 1/181* (2013.01); *H05K 5/0047* (2013.01); *H05K 2201/10151* (2013.01); *H05K 2201/1031* (2013.01)

(58) Field of Classification Search
CPC ....... H05K 5/0047; H05K 2201/10151; H05K 2201/1031; H05K 3/284; G01H 11/08
See application file for complete search history.

(56) References Cited

U.S. PATENT DOCUMENTS

| | | | | |
|---|---|---|---|---|
| 2003/0028110 | A1* | 2/2003 | Toda ........................ | A61B 7/04 |
| | | | | 600/437 |
| 2013/0307094 | A1* | 11/2013 | Yoshiuchi .......... | G01C 19/5783 |
| | | | | 257/415 |
| 2014/0346926 | A1* | 11/2014 | Choi ....................... | G06F 3/041 |
| | | | | 310/323.01 |
| 2018/0009003 | A1* | 1/2018 | Kim ..................... | H10N 30/883 |
| 2018/0226564 | A1* | 8/2018 | Itayama ................... | B06B 1/06 |
| 2020/0378823 | A1* | 12/2020 | Omote ................... | G01H 11/06 |
| 2020/0408594 | A1* | 12/2020 | Omote ................. | H05K 5/0026 |

* cited by examiner

*Primary Examiner* — Sherman Ng
(74) *Attorney, Agent, or Firm* — Barley Snyder

(57) ABSTRACT

A vibration detector includes a housing, a cover plate, a piezoelectric sensing module, and a PCBA module. The piezoelectric sensing module is arranged in the housing and generates a piezoelectric signal in response to vibration of the cover plate. The PCBA module is arranged in the housing and is electrically coupled to the piezoelectric sensing module. The PCBA module is adapted to receive the piezoelectric signal from the piezoelectric sensing module and to generate a detection signal based on the piezoelectric signal.

20 Claims, 2 Drawing Sheets

VIBRATION DETECTOR AND ELECTRICAL APPARATUS HAVING THE SAME

CROSS-REFERENCE TO RELATED APPLICATION(S)

This application claims the benefit of Chinese Patent Application No. 202211060362.0, filed Aug. 31, 2022, the whole disclosure of which is incorporated herein by reference.

FIELD OF THE INVENTION

Embodiments of the present disclosure relate to the field of sensing equipment, and more particularly, to a vibration detector and an electrical apparatus having the same.

BACKGROUND

Technological developments have driven consumer demands for improved aesthetics, ease of use, and intelligence of household appliances. As a result, the design of electrical apparatuses including intelligent sensing and control systems are at the forefront of the industry.

More specifically, household appliances are often operable via the use buttons and remote controls. For example, common actions include turning on or off an air conditioner via a remote control, and opening or closing a refrigerator door by pulling or pushing a refrigerator door handle. However, in practice, a user may need to spend time locating a given remote control, as they are often misplaced after use. Likewise, a refrigerator door handle may easily get dirty due to its frequent contact with hands. Further, it is inconvenient to open or close the refrigerator door by pulling or pushing the door handle, resulting in a poor user experience.

SUMMARY

According to an embodiment of the present disclosure, a vibration detector includes a housing, a cover plate, a piezoelectric sensing module, and a PCBA module. The piezoelectric sensing module is arranged in the housing and generates a piezoelectric signal in response to vibration of the cover plate. The PCBA module is arranged in the housing and is electrically coupled to the piezoelectric sensing module. The PCBA module is adapted to receive the piezoelectric signal from the piezoelectric sensing module and to generate a detection signal based on the piezoelectric signal.

BRIEF DESCRIPTION OF THE DRAWINGS

The invention will now be described by way of example with reference to the accompanying Figures, of which.

DETAILED DESCRIPTION OF THE EMBODIMENTS

Figure 1:
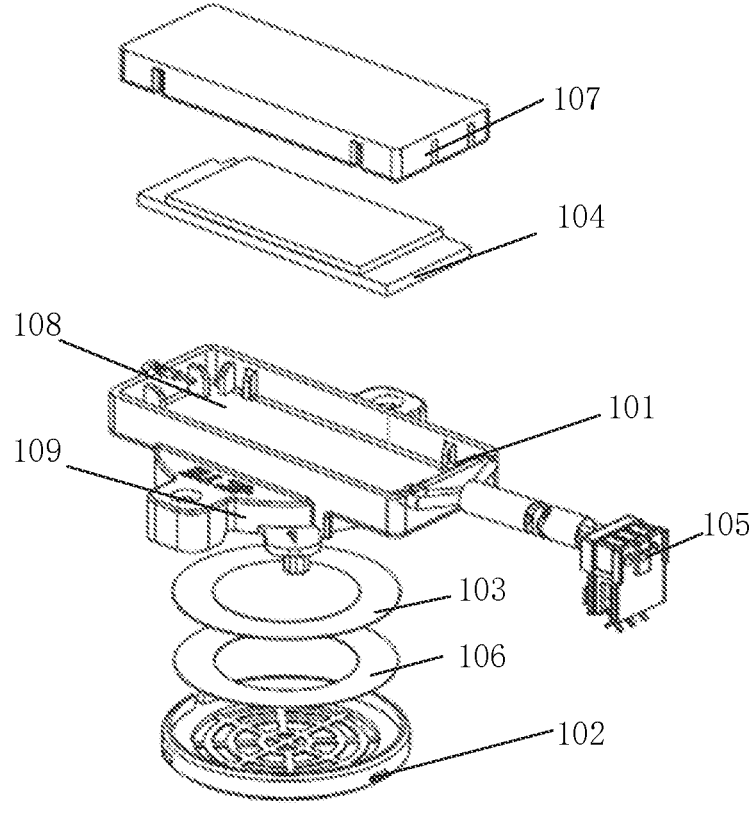
FIG. 1 is an exploded view of a vibration detector according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A vibration detector according to an embodiment of the present disclosure can be applied to any suitable household appliance or industrial electrical apparatus, such as range hood, refrigerator, oven, food processor, washing machine, intelligent water tap, or intelligent closestool. The following describes the application of an exemplary vibration detector of the present disclosure to a refrigerator by way of non-limiting example.

Figure 2:
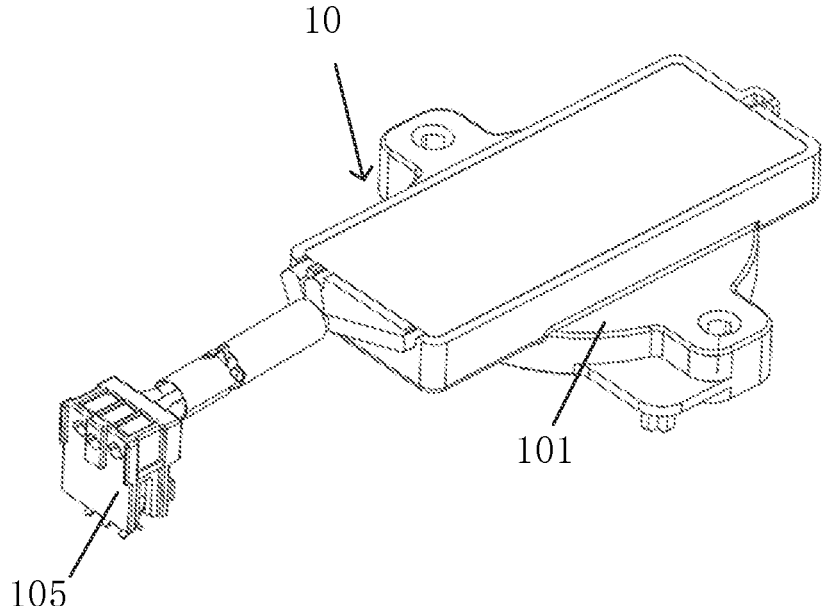
FIG. 2 is a schematic perspective view of the vibration detector according to an embodiment of the present disclosure.

FIG. 1 and FIG. 2 show an exploded view and a perspective view of the exemplary vibration detector, respectively. Referring to FIGS. 1 and 2, the vibration detector 10 includes a housing 101, a cover plate 102, a piezoelectric sensing module 103, a printed circuit board assembly (PCBA) module 104, and a signal transmission module 105. The PCBA module 104 can be electrically coupled to the piezoelectric sensing module 103, for example, through an electrical connection wire. The signal transmission module 105 can be electrically coupled to the PCBA module 104 through an electrical connection wire.

The piezoelectric sensing module 103 is arranged in the housing 101, and can be fixed on the cover plate 102 with an adhesive tape 106, so that the piezoelectric sensing module 103 is tightly attached to the cover plate 102. The cover plate 102 can be made of plastic material. When the vibration detector 10 is installed into a refrigerator door to detect vibration, a part of the mechanical housing of the refrigerator door abuts against the cover plate 102 of the vibration detector 10. When the user taps the mechanical housing of the refrigerator with their hand, the cover plate 102 of the vibration detector 10 accordingly vibrates.

The piezoelectric sensing module 103 is configured to generate a piezoelectric signal in response to vibration of the cover plate 102. In this embodiment, the piezoelectric sensing module 103 includes a piezoelectric sheet. The piezoelectric sheet adopts a structure similar to that of a capacitor, wherein a bottom layer of the piezoelectric sheet is a disk made of nickel metal, a middle layer is made of a ceramic medium, and a top layer thereof is conductive silver paste applied on the ceramic medium. After sensing vibration, the piezoelectric sheet outputs an electrical signal including capacitance and vibration frequency. In other examples, the piezoelectric sensing module 103 may be a piezoelectric film.

The PCBA module 104, which is a finished circuit board equipped with electronic components, is also arranged in the housing 101. Optionally, the vibration detector 10 further includes a potting adhesive 107 for fixing the PCBA module 104 in the housing 101. The potting adhesive 107 covers the surface of the PCBA module 104, and can also provide sealing, moisture-proof, and anti-corrosion effects. The PCBA module 104 is configured to receive the piezoelectric signal from the piezoelectric sensing module 103 and generates a detection signal based on the piezoelectric signal.

Specifically, the PCBA module 104 is configured to filter the piezoelectric signal to obtain the piezoelectric signal generated by the vibration of the cover plate 102 caused by tapping. In addition, the PCBA module 104 is also configured to amplify the received piezoelectric signal, and ultimately generates a detection signal indicating whether tapping has occurred. Thus, the PCBA module 104 is adapted to at least filter and amplify the piezoelectric signal, wherein the sequence of filtering and amplifying is not limited.

Referring to FIG. 1, the housing 101 includes at least two accommodating cavities arranged thereon, which are separated by a part of the housing. One accommodating cavity 109 is configured to accommodate the piezoelectric sensing module 103 and another accommodating cavity 108 is configured to accommodate the PCBA module 104. Specifically, the at least two accommodating cavities of the housing 101 are stacked up and down or vertically, and are separated by a part of the housing located therebetween.

As shown in FIG. 1, the upper accommodating cavity 108 is configured to accommodate the PCBA module 104, and the lower accommodating cavity 109 is configured to accommodate the piezoelectric sensing module 103. The PCBA module 104 and the piezoelectric sensing module 103 are integrated in one housing 101, which can effectively reduce the volume of the vibration detector 10 and facilitate the miniaturization thereof. The housing 101 can be made of metal or plastic. Further, fixing holes are arranged on two sides of the housing 101, so as to conveniently install the vibration detector inside the refrigerator door with screws. In addition, the housing 101 can also be fixed by any other conceivable means, such as snapping, riveting, and welding.

The signal transmission module 105 is configured to transmit the detection signal to the electrical apparatus to be controlled (in this embodiment, the refrigerator). Referring to FIG. 1, the signal transmission module 105 includes a connector wire harness. In other embodiments, the signal transmission module 105 may not necessarily be wired, but can be a wireless transmission device. In addition, the connector wire harness electrically coupled to the electrical apparatus can also supply power to the PCBA module 104 and/or the piezoelectric sensing module 103. In other embodiments, a battery may be arranged in the vibration detector 10 to supply power to the PCBA module 104 and/or the piezoelectric sensing module 103.

When the user taps the refrigerator door with their hand, the vibration detector 10 quickly detects the vibration and sends the detection signal to a main control board or controller of the refrigerator. The main control board of the refrigerator sends an instruction to open the door based on the detection signal, and controls the refrigerator door to open. Refrigerators having this automatic sensing function are more intelligent and automated compared to conventional refrigerators. The vibration detector 10 plays an indispensable role in the automatic sensing process of the refrigerator.

Although the above embodiment only describes the application of the vibration detector 10 to refrigerator doors, it can be easily understood that when an electrical apparatus such as air conditioner, food processor, or intelligent closestool includes the vibration detector, the electrical apparatus is configured to perform, in response to the detection signal, corresponding control operations such as blowing, heating food, or flushing. Specifically, these electrical apparatuses include a mechanical housing that abuts against the cover plate of the vibration detector, wherein the electrical apparatus is configured to perform the control operation above in response to a tapping on the mechanical housing.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of the elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A vibration detector, comprising:
 a housing;
 a cover plate;
 a piezoelectric sensing module arranged in the housing and generating a piezoelectric signal in response to vibration of the cover plate; and
 a PCBA module arranged in the housing and electrically coupled to the piezoelectric sensing module, the PCBA module adapted to receive the piezoelectric signal from the piezoelectric sensing module and generate a detection signal based on the piezoelectric signal.

2. The vibration detector according to claim 1, further comprising a signal transmission module electrically coupled to the PCBA module and adapted to transmit the detection signal to an electrical apparatus to be controlled.

3. The vibration detector according to claim 2, wherein the housing defines:
 a first cavity accommodating the piezoelectric sensing module; and
 a second cavity accommodating the PCBA module.

4. The vibration detector according to claim 3, wherein the first and second cavities are the separated by a portion of the housing.

5. The vibration detector according to claim 4, wherein the first and second cavities are stacked in a vertical direction.

6. The vibration detector according to claim 5, wherein the second cavity is arranged above the first cavity in the vertical direction.

7. The vibration detector according to claim 2, wherein the signal transmission module includes an electrical-connector wire harness.

8. The vibration detector according to claim 7, wherein the electrical-connector wire harness supplies power to at least one of the PCBA module or the piezoelectric sensing module.

9. The vibration detector according to claim 1, wherein the piezoelectric sensing module includes a piezoelectric sheet.

10. The vibration detector according to claim 1, further comprising a potting adhesive fixing the PCBA module in the housing.

11. The vibration detector according to claim 1, wherein the PCBA module is adapted to at least filter and amplify the piezoelectric signal.

12. The vibration detector according to claim 11, wherein the PCBA module is adapted to filter the piezoelectric signal to obtain the piezoelectric signal generated by the vibration of the cover plate caused by tapping.

13. The vibration detector according to claim 1, wherein the piezoelectric sensing module is directly attached to the cover plate.

14. The vibration detector according to claim 13, wherein the piezoelectric sensing module is fixed to the cover plate via an adhesive tape.

15. The vibration detector according to claim 1, wherein:
the cover plate and the piezoelectric sensing module are circular in shape and are arranged within a corresponding circular first cavity of the housing; and
the PCBA module is rectangular in shape and is arranged within a corresponding rectangular second cavity of the housing arranged above the first cavity.

16. The vibration detector according to claim 15, wherein the first cavity and the second cavity are formed integrally with a remainder of the housing.

17. An electrical apparatus, comprising:
a vibration detector, including:
  a housing;
  a cover plate;
  a piezoelectric sensing module arranged in the housing and attached to the cover plate, the piezoelectric sensing module generating a piezoelectric signal in response to vibration of the cover plate;
  a PCBA module arranged in the housing and electrically coupled to the piezoelectric sensing module, the PCBA module adapted to receive the piezoelectric signal from the piezoelectric sensing module and generate a detection signal based on the piezoelectric signal; and
  a signal transmission module electrically coupled to the PCBA module and adapted to transmit the detection signal to an electrical apparatus to be controlled; and
a control board operatively coupled to the vibration detector and adapted to perform a control operation in response to the detection signal.

18. The electrical apparatus according to claim 17, wherein the electrical apparatus further comprises a mechanical housing that abuts against the cover plate of the vibration detector.

19. The electrical apparatus according to claim 18, wherein the electrical apparatus is adapted to perform the control operation in response to a tapping on the mechanical housing.

20. The electrical apparatus according to claim 17, wherein the housing defines:
a first cavity accommodating the piezoelectric sensing module; and
a second cavity accommodating the PCBA module.

\* \* \* \* \*